United States Patent
Molander (10) Patent No.: US 6,286,996 B1
(45) Date of Patent: Sep. 11, 2001

(54) METHOD AND ARRANGEMENT FOR MEASURING TEMPERATURE OF A SEMICONDUCTOR COMPONENT IN AN INACTIVE STATE

(75) Inventor: Mats Erik Molander, Sollentuna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/397,506

(22) Filed: Sep. 17, 1999

(30) Foreign Application Priority Data

Sep. 18, 1998 (SE) .................................. 9803178-4

(51) Int. Cl.$^7$ ................. G01K 1/02; G01K 7/01
(52) U.S. Cl. ................. 374/152; 374/178; 327/512
(58) Field of Search .................. 374/183, 178, 374/163, 152, 141; 327/512

(56) References Cited

U.S. PATENT DOCUMENTS

| | | | |
|---|---|---|---|
| 4,669,025 | * 5/1987 | Barker, III et al. | 327/512 |
| 4,896,196 | * 1/1990 | Blanchard et al. | 257/470 |
| 4,972,136 | 11/1990 | Banura | 323/275 |
| 5,063,307 | 11/1991 | Zommer | 327/512 |
| 5,337,006 | 8/1994 | Miyazaki | 330/130 |
| 5,383,083 | * 1/1995 | Shinoda et al. | 361/103 |
| 5,473,260 | * 12/1995 | Hauswirth et al. | 327/512 |
| 5,796,290 | * 8/1998 | Takahashi | 327/512 |
| 6,008,685 | * 12/1999 | Kunst | 327/512 |

FOREIGN PATENT DOCUMENTS

| | | |
|---|---|---|
| 19522517 C1 | 11/1996 | (DE) . |
| 481524 A2 | 4/1992 | (EP) . |
| 922542 | * 4/1919 | (SU) .................... 374/152 |
| 98/21820 A1 | 5/1998 | (WO) . |
| 98/26487 A1 | 6/1998 | (WO) . |

OTHER PUBLICATIONS

Siegel, "Measuring thermal resistance is the key to a cool semiconductor," Electronics, vol. 51, No. 14, 1978, pp. 121–126.*

* cited by examiner

Primary Examiner—Diego Gutierrez
Assistant Examiner—Stanley J. Pruchnic, Jr.
(74) Attorney, Agent, or Firm—Burns, Doane, Swecker & Mathis, L.L.P.

(57) ABSTRACT

The present invention relates to a method and to arrangements for measuring temperature in an intermittently operating semiconductor. The method comprises the following steps:

establishing that the semiconductor is in an inactive period;

connecting a measuring circuit to the semiconductor;

measuring a temperature-dependent electric quantity of the semiconductor component; and converting the measured quantity to a temperature value that corresponds to the temperature of the semiconductor component.

24 Claims, 5 Drawing Sheets

METHOD AND ARRANGEMENT FOR MEASURING TEMPERATURE OF A SEMICONDUCTOR COMPONENT IN AN INACTIVE STATE

This application claims priority under 35 U.S.C. §§119 and/or 365 to 9803178-4 filed in Sweden on Sep. 18, 1998; the entire content of which is hereby incorporated by reference.

FIELD OF INVENTION

The present invention relates to a method and to an arrangement for measuring temperature in a semiconductor component.

BACKGROUND OF THE INVENTION

The radio transmitter is an important part of, for example mobile telephony systems. A transmitter in radio communications equipment will comprise, among other things, a power amplifier in which transistors are included. A transistor will generate heat at high powers. Typical problems that may occur are overheating and parameter changes. Overheating can damage the transistor and render it totally unserviceable. A change in temperature can change the parameters of the transistor and result in interferences. To prevent overheating, and therewith transistor damage, or parameter changes and therewith interferences, it is important that the transistor junction temperature can be measured correctly. When the temperature of a transistor is known, damage can be prevented or compensation made for any parameter changes that may occur. This is important and often essential in systems in which high performance is required. Mobile telephone systems are examples of such systems.

One typical method of measuring the temperature of a power transistor is to place a temperature sensor in the proximity of the heat-conducting outer casing of the transistor, for instance on a cooling fin. This method is unsatisfactory in many cases, since it is then the temperature of the outer casing that is measured rather than the junction temperature of the transistor. The measured values are therewith thermally delayed as a result of the physical distance between the active transistor parts and the temperature sensor. The temperature measurement is also misleading, since the temperature value decreases with the distance between the transistor and the temperature sensor. There is a danger that a sudden increase in temperature will not be measured until it is too late, in other words until the transistor has already been damaged. To prevent this, it is necessary to introduce large safety margins, which, in turn, increases costs. Other methods of measuring the temperature of a transistor are known to the art. U.S. Pat. No. 5,383,083 describes how the temperature of a transistor is measured by connecting a measuring circuit to the transistor base and registering the voltage across the base-emitter of the transistor, and converting the measurement to a temperature value. One drawback with this technique is that normal transistor operation will disturb the temperature measuring process, or vice versa that the measuring process will disturb the normal operation of the transistor.

SUMMARY OF THE INVENTION

The present invention addresses the problem of enabling the junction temperature of an intermittently operating semiconductor component, for instance a transistor, to be measured correctly without interference between the measuring process and transistor operation.

This problem is solved in accordance with the invention, by waiting for a pause in the actual work carried out by the semiconductor component. The temperature is then measured when the component is in its inactive state.

More specifically, when the semiconductor component is a bipolar transistor the problem is solved by forming the temperature sensor from a part of the transistor and by supplying the transistor base with a known current that is kept constant during the temperature measuring process. An inactive period is detected, i.e. a pause in normal transistor operation, for instance a pause between transmissions in a radio transmitter. According to the invention, a measuring circuit is connected to the semiconductor component, for example to the base of the transistor, during this pause in transmission. The measuring circuit measures the base-emitter voltage and the voltage is then converted to a temperature value that corresponds to the transistor temperature when correctly calibrated.

Another problem addressed by the invention is one of measuring the temperature of a semiconductor component without needing to pay attention to thermal delay.

This problem is solved in accordance with the invention by forming the temperature sensor from a part of the semiconductor component.

One object of the present invention is to prevent the normal operation of a semiconductor component from being disturbed by the temperature measuring process.

Another object of the invention is to prevent the signals obtained with the temperature measuring process from being drowned in the signalling occurring in a normally operating semiconductor component.

Still another object of the invention is to prevent a thermal delay in the temperature measuring process from resulting in an erroneous measurement, therewith requiring margins to be employed by expensive over-dimensioning in respect of cooling the semiconductor component, its power durability or temperature durability.

Another object of the invention is to enable the effects of the temperature change to be corrected in good time before the fault occurs. This correction may, for instance, comprise increased cooling of the semiconductor component.

Yet another object of the invention is to compensate for variations in the modus operandi caused by temperature change. Compensation may, for instance, consist of changing the operating or working point of the semiconductor component to the value that existed prior to the change in temperature. Thus, one advantage afforded by the invention is that the temperature measuring process and operation of the semiconductor component will not interfere with one another.

Another advantage is that the measurement result will be correct, which results in low costs.

The invention will now be described in more detail with reference to exemplifying embodiments thereof and also with reference to the accompanying drawings.

PREFERRED EMBODIMENTS OF THE INVENTION

Figure 1:
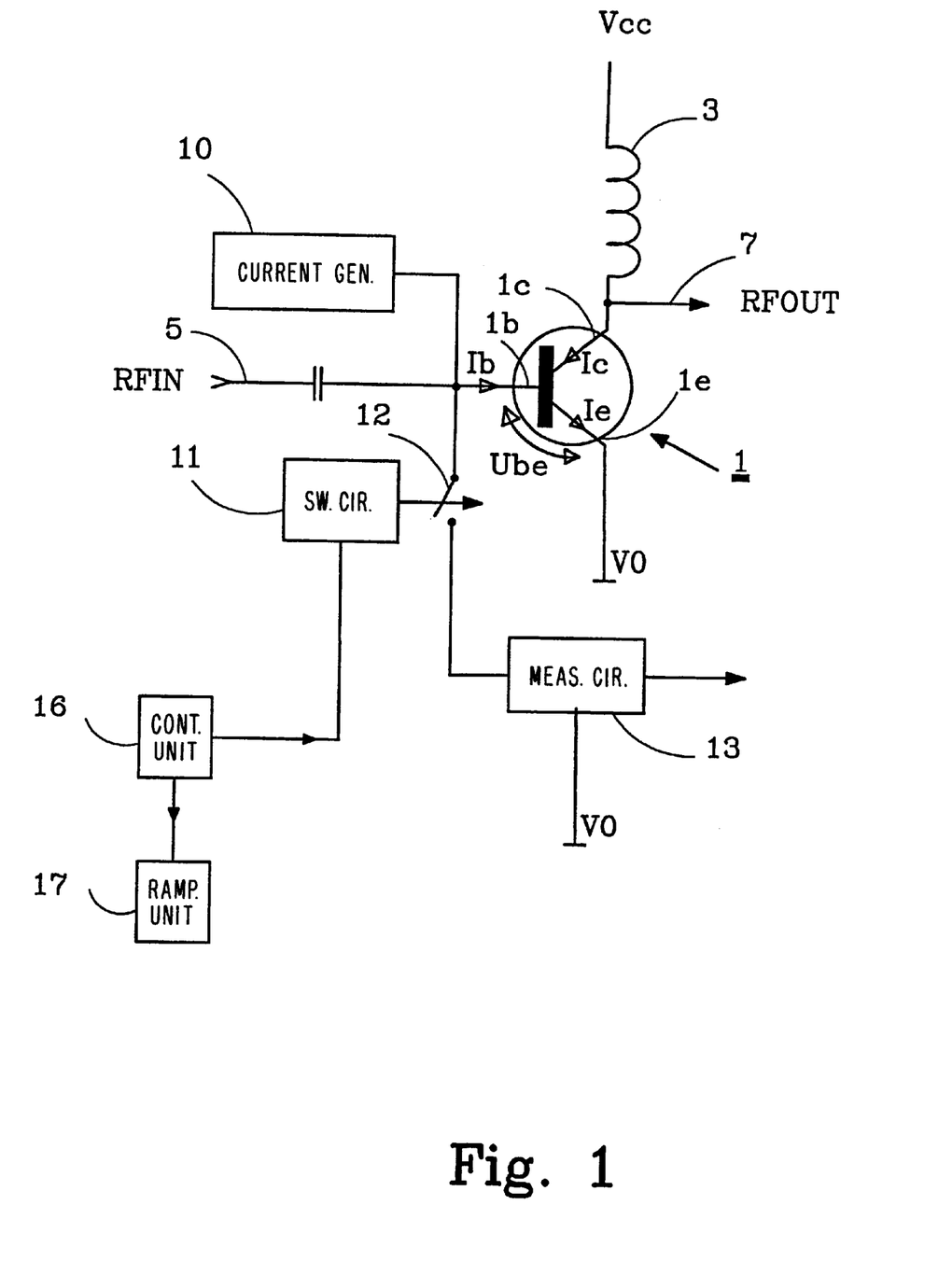
FIG. 1 is a circuit diagram of a bipolar transistor in a common-emitter-coupling including a temperature measuring device in accordance with the invention.

Transmitters in mobile telephone systems include power amplifiers. FIG. 1 illustrates a first embodiment which includes a number of radio-frequency power amplifier stages for an intermittently operating transmitter. This type of transmitter is often found in GSM-type mobile radio systems, for instance. The power amplifier stage, which in the illustrated embodiment is placed in a base station of a GSM-system, is comprised of a bipolar power transistor 1 that includes a base 1b, an emitter 1e and a collector 1c. A coil 3 is connected between a supply voltage Vcc and the transistor collector 1c. The transistor emitter 1e is connected to a zero potential V0. A radio frequency signal RFIN is applied to the input 5 of the amplifier stage at the transistor base 1b. Subsequent to being processed in the transistor, the amplified radio frequency signal is forwarded to the output 7 of the amplifier stage between the coil 3 and the collector 1c of the transistor. The base is given a fixed current that flows through the transistor base and determines the operating point of the transistor, through the medium of a biasing circuit on said transistor base 1b. This will be discussed more closely with reference to FIGS. 2a and 2b. Shown in FIG. 1 is a switching circuit 11, an electronically controlled switch 12 and a measuring circuit 13. These components will be described in more detail further on.

Figure 2A:
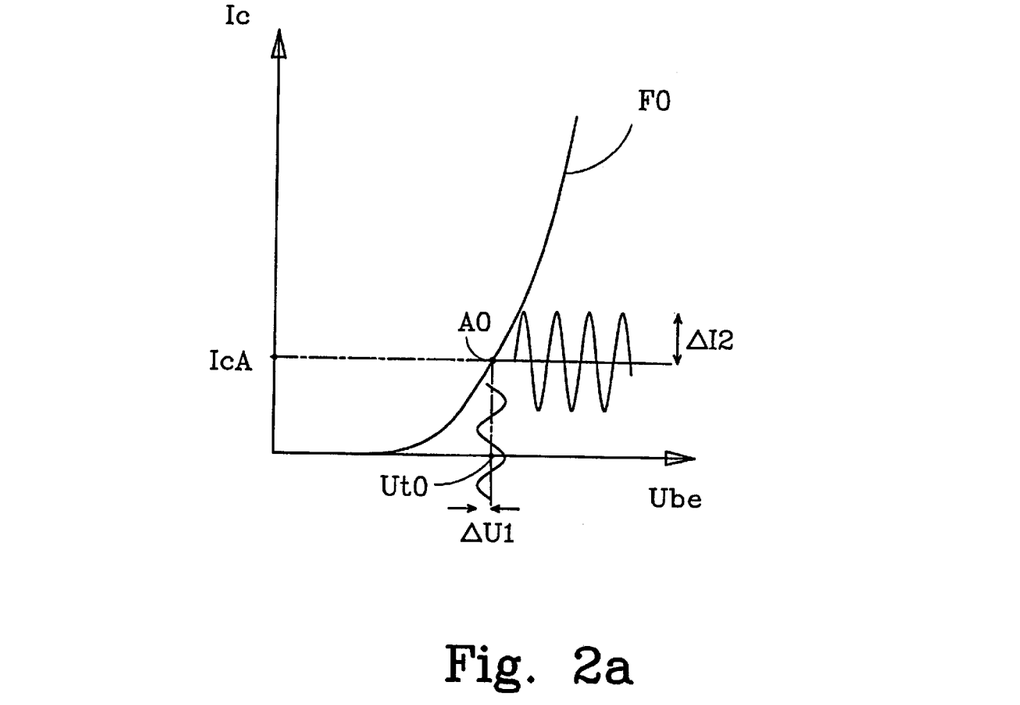
FIG. 2a shows the collector current of the transistor as a function of the base-emitter-voltage and also shows how input and output signals vary around an operating point when the transistor is in an active state.

FIG. 2a is a current/voltage diagram that illustrates the base-emitter-diode characteristic of the transistor in FIG. 1. The working point A0 of the transistor is adjusted with the aid of the current generator 10. As a result of the current generator, a fixed base current will flow through the transistor and a direct current IcA will flow through the collector. The operating point A0 constitutes the point of intersection between the base-emitter-voltage Ut0 and the collector direct current IcA. In the illustrated embodiment, the radio frequency signal RFIN, which has, e.g., been modulated with speech and control data, gives rise to a varying base voltage ΔU1 across the base-emitter-junction of the transistor. The base voltage results in a collector current ΔI2 which overlays the collector direct current IcA. The varying collector current ΔI2 gives rise to the radio frequency signal RFOUT exiting on the transistor output.

Figure 2B:
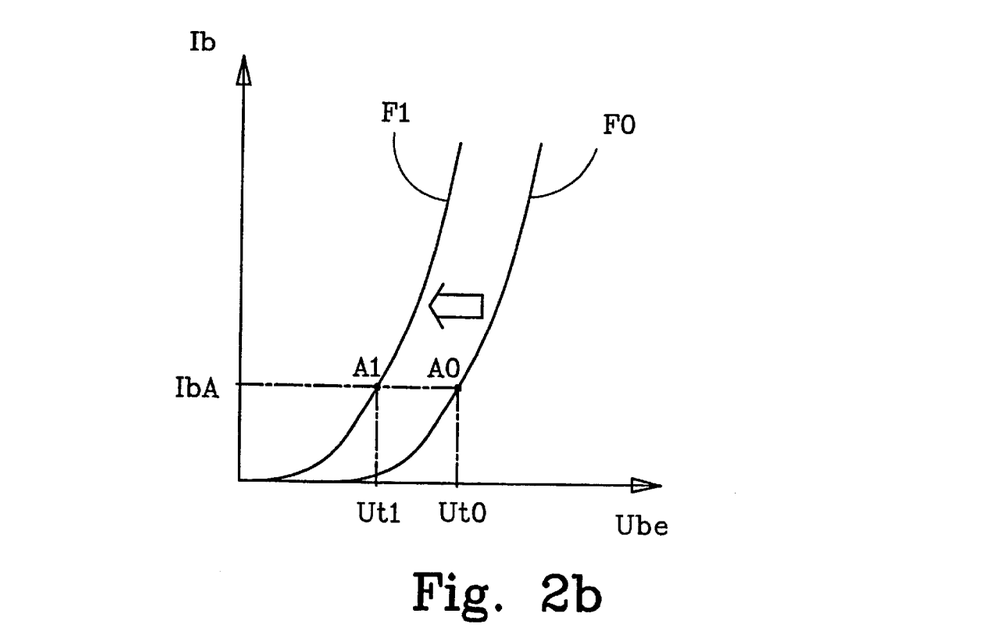
FIG. 2b shows the base current of the transistor as a function of the base-emitter-voltage in the event of a temperature increase.

FIG. 2b shows the characteristic for the base-emitter-diode of the transistor in the event of a temperature increase, by means of two curves F0 and F1. The base-emitter-diode characteristic can be described by the following formula:

$$I(U) = I_0 \cdot \left( e^{\frac{qU}{\lambda \cdot k \cdot T}} \right)$$

I=The current in the base-emitter-junction
U =Base-emitter-voltage
$I_0$=The measuring current in the reverse direction
q=The electron charge
λ=Material constant
k=Boltzmann's constant
T=The absolute temperature A first curve F0 shows the characteristic prior to the temperature increase. The operating point A0 is a point on the curve at the base direct current IbA. The base-emitter-voltage at the intersection point A0 is the voltage referenced Ut0. If the temperature rises, the characteristic curve will move in the arrowed direction and, for instance, take the position designated F1 in FIG. 2b. Because the base current is kept constant with the aid of the current generator 10, the operation point will be forced to remain at the current IbA. As a result, the base-emitter-voltage, which is an approximate linear function of the temperature change, will fall at the operation point and a new operation point A1 will arise as a result of the temperature increase. The new operation point A1 is apparent from FIG. 2b. The operation point A1 now constitutes a point of intersection between the base direct current IbA and the new base-emitter voltage Ut1 subsequent to the temperature change.

The approximate linear relationship between the junction voltage Ube and the junction temperature T can be shown with the formula below, if the temperature dependency of $I_0$ is ignored:

$$U(T) = \frac{\ln\left(\frac{I_{bias}}{I_0} + 1\right)}{q} \cdot k \cdot T = konst \cdot T$$

Because the base-emitter-voltage Ube is essentially linearly dependent on the temperature of the transistor, it would be natural to estimate the temperature by measuring the voltage. However, the problem is that a temperature measuring process that is ongoing whilst a transmitter is transmitting will result in the signals that are sent during normal transistor operation affecting the highly sensitive temperature measuring process, therewith making it quite impossible to carry out the process in many cases. It has therefore been chosen in accordance with the invention to include an electronic switch 12 between the transistor base 1b and the measuring circuit 13. The switch has been illustrated in FIG. 1 with a switch symbol. In the illustrated embodiment, the switch includes a transmission gate whose main components are reversed FET-transistors (not shown in FIG. 1). This switch variant is well known to the person skilled in this art. Other variants may be used without departing from the inventive concept. The electronic switch is controlled by the switching circuit 11. In the illustrated embodiment, the transmitter is located in a base station in a GSM-system. A transmitter in a radio base station operates intermittently, i.e. bursts are transmitted during the periodic transmissions. So-called normal bursts and access bursts are examples of such bursts. The normal bursts are used to send information over the traffic channels and over certain control channels. These periodic transmissions are interspersed with transmission pauses. To enable the duration of the transmissions and the pauses therebetween to be detected, the switching circuit 11 is connected to a control unit 16 in the base station. The control unit controls a ramping unit 17 which is activated to ramp-up the output power of the transmission stage shortly before each transmission occasion, and also to ramp-down the output power of the transmission stage shortly before each transmission pause. The control unit 16 informs the ramping unit 17 when it is time to begin transmitting, and the switching circuit 11 may also be informed to this effect on this occasion. Correspondingly, the ramping unit is activated and the switching circuit is informed when it is time for a transmission pause. Prior to each ramping-up of the transmitter stage output power, i.e. before each transmission occasion, the switching circuit 11 is activated and the electronic switch 12 broken. Subsequent to each down ramping of the transmitter stage output power, i.e. before each transmission pause, the switching circuit 11 is activated and the electronic switch 12 is closed and the measuring circuit 13 is coupled in.

A method according to the invention will now be described. The reference signs used in this description of the method correspond to those shown in FIGS. 1 and 2. The object of the method is to reproduce the temperature of a power transistor correctly without disturbing normal transistor operation, and vice versa. The known, constant closed-circuit current delivered by the current generator 10 to the transistor base determines the operating point for normal transistor operation and for the temperature measuring point. The measuring circuit 13 is pre-calibrated, in the form of a conversion function, with respect to the individual, combined temperature behaviour of the transistor concerned and of the electronic switch. The conversion function describes how a measured value of the base-emitter-voltage of the transistor shall be converted to a correct value of the prevailing transistor temperature.

The description begins from a transmission occasion and the method comprises the following steps:

The control unit 16 activates the ramping unit 17 so as to ramp down the output power of the transmitter stage, i.e. informs the ramping unit that it is time to end transmission, and then sends a control signal to the switching circuit 11.

The switching circuit 11 senses that the intermittently working transmitter is between two bursts and that a transmission pause is ongoing.

The switching circuit actuates the electronic switch and the connection between the transistor base 1b and the measuring circuit 13 is closed.

The measuring circuit 13 reads the voltage across the base-emitter of the transistor. Since the transistor is in an inactive period, the value that is read will not be affected by signals that are sent during normal operation of the transistor.

The measuring circuit, which is calibrated with respect to the combined temperature behaviour as described above, converts the measured voltage to a temperature value which corresponds correctly to the temperature of the transistor.

The control unit 16 sends a new control signal to the switching circuit 11 and thereafter causes the ramping unit 17 to ramp up the transmitter stage output power, i.e. informs the switching circuit that it is time to recommence transmission.

The switching circuit actuates the electronic switch so as to break the connection between the transistor base and the measuring circuit 13. The transistor is able to begin normal operation without being disturbed by signals that derive from the measuring circuit 13.

It is also conceivable to feed the measured temperature value back to a cooling circuit (not shown in the drawings) that functions to cool the transistor in the case of high temperatures. A possible variant is to feedback the temperature value so that the power of the input signal will be reduced by the same extent as the temperature increases, such as to obtain a self-regulating system. The invention also provides room for compensating for variations in the modus operandi of the transistor caused by temperature changes. For instance, compensation may consist in changing the operation point of the transistor to the value that existed prior to the temperature change.

Figure 3:
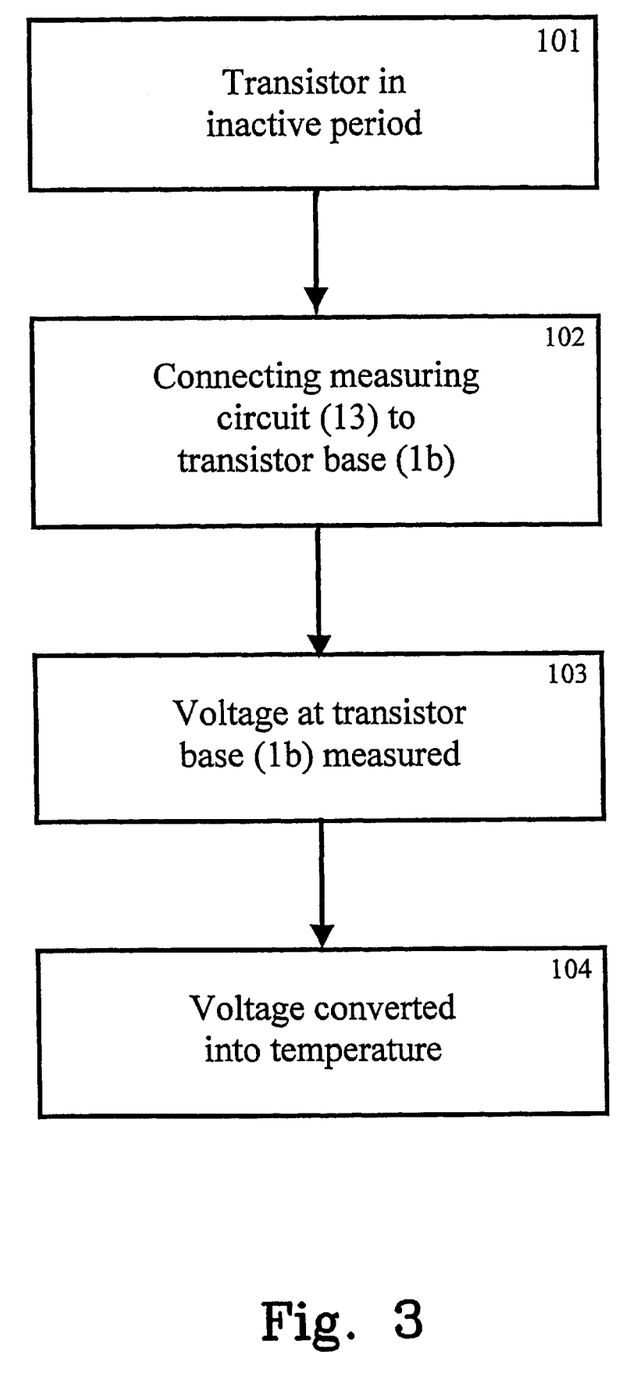
FIG. 3 is a flowchart illustrating a method according to the invention.

FIG. 3 is a flowsheet illustrating the most essential steps of the inventive method. The flowchart is intended to be read together with FIGS. 1 and 2, which show the reference signs included in the flowsheet. The method comprises the following steps:

The switching circuit 11 is informed that the transistor is in an inactive period, according to block 101.

The measuring circuit 13 is connected to the transistor base, according to block 102.

The voltage at the transistor base is measured, according to block 103.

The measured voltage is converted to a temperature value, according to block 104.

Figure 4:
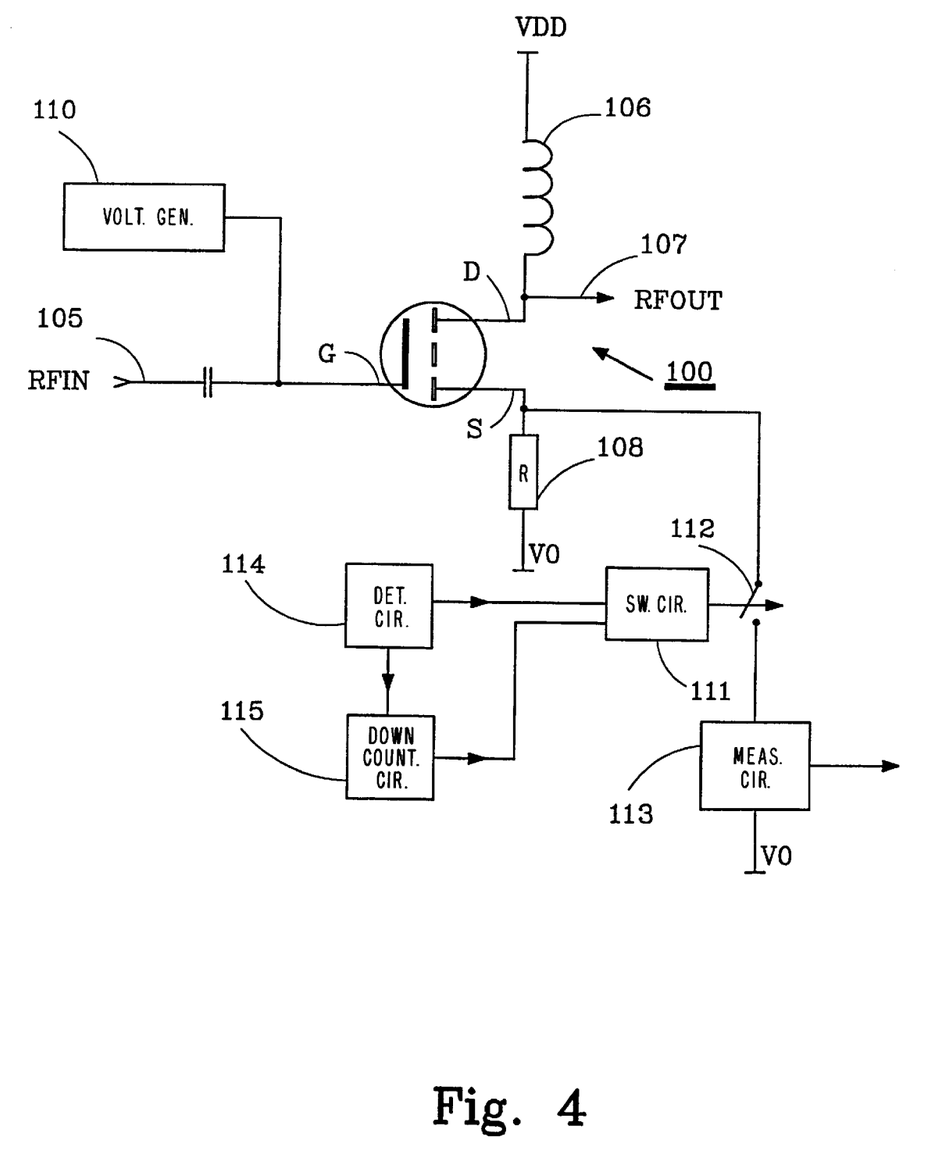
FIG. 4 is a circuit diagram of an FET-transistor in common-source-coupling, and a temperature measuring device according to the invention.

FIG. 4 illustrates a second embodiment and shows a part of a radio frequency power amplifier stage for an intermittently operating transmitter. In this embodiment, the power amplifier stage is placed in a base station in a DECT system, comprising a field effect transistor 100 that includes a gate G, a source S and a drain D. A coil 106 is connected between a supply voltage VDD and the drain D of the transistor. The transistor source is connected to a zero potential VO via a resistance 108. A radio frequency signal RFIN is delivered to the input 105 of the amplifier stage at the transistor gate G. Subsequent to being processed in the transistor, the amplified radio frequency signal RFOUT is passed to the amplifier stage output 107 located between the coil 106 and the transistor drain D. The gate is given a fixed bias voltage that determines the operating point of the transistor, through the medium of a voltage generator 110 on the transistor gate G. This will be discussed in more detail below, with reference to FIG. 5. The FIG. 4 embodiment also includes a switching circuit 111, and electronically controlled switch 112, a measuring circuit 113, a detector circuit 114, and a down-counting circuit 115. These components will be described in more detail further on.

Figure 5:
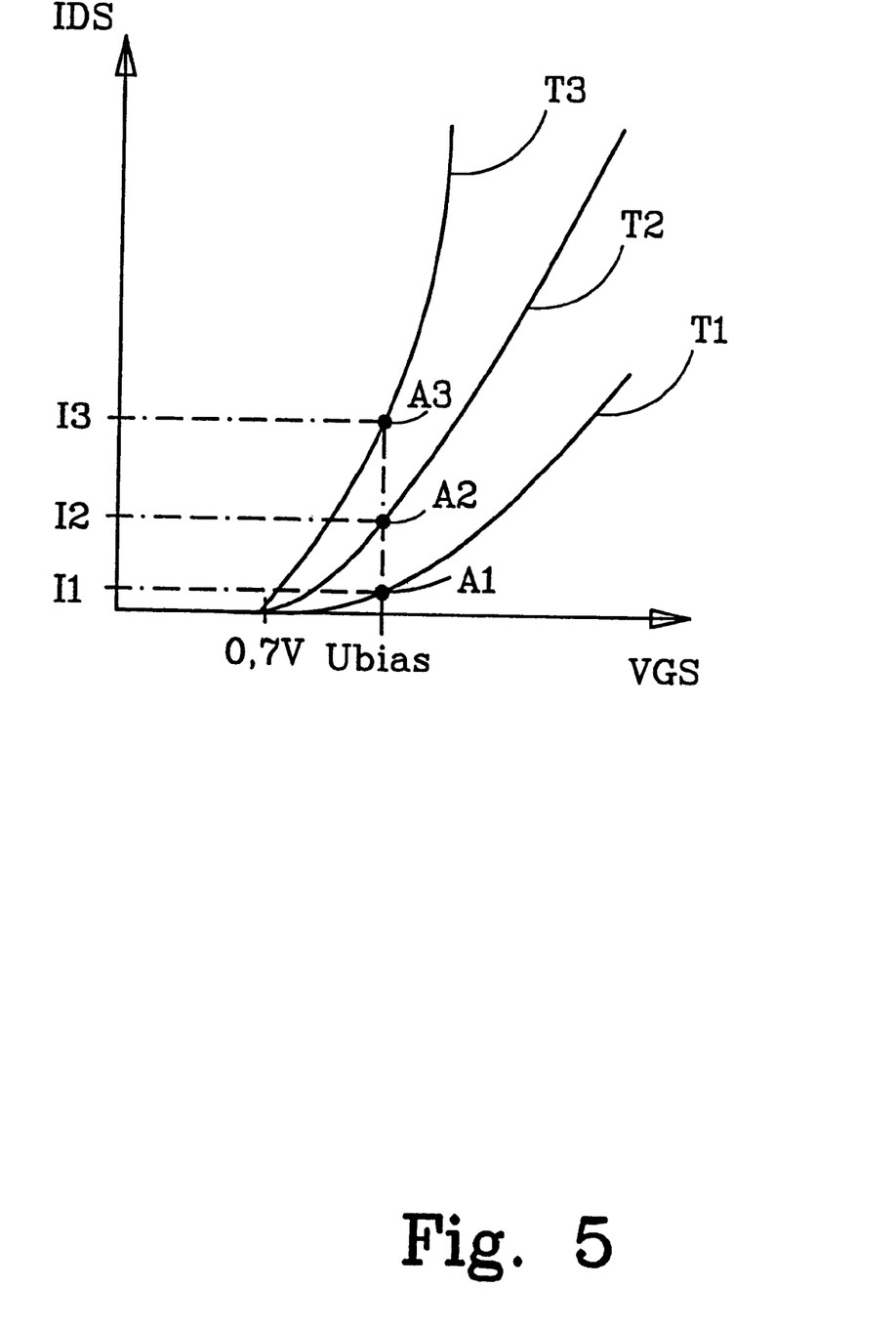
FIG. 5 illustrates the drain-source-current of the FET-transistor as a function of the gate-source-voltage at a few different temperatures.

FIG. 5 illustrates the transfer function of the FET-transistor in FIG. 4, in the form of a current/voltage diagram representing three different temperatures. The X-axis shows the gate-source-voltage VGS of the transistor, whereas the Y-axis shows the current between the transistor drain D and the transistor source S. The first operating point A2 of the transistor at temperature T2 is apparent from the center curve of said three curves. A fixed closed-circuit voltage is obtained with respect to the transistor gate-source at the value Ubias, with the aid of the voltage generator 110. The drain source current will then have assumed the value I2. The operating point A2, which is the point about which incoming and outgoing signals are superimposed, thus constitutes a point of intersection between the voltage Ubias and the current I2. Shown in the Figure are three curves T1, T2 and T3 which illustrate the transfer function of the transistor in response to a change in temperature. The first transfer curve T2 shows the transfer function prior to a temperature change. If the temperature rises, the transfer curve will move and take the position referenced T3 in FIG. 2. If the temperature falls, the transfer function will move in the opposite direction and take the position referenced T1 in the Figure. Because the voltage at the operating point has been fixed to the voltage Ubias with the aid of the voltage generator 110, the operating point will be maintained at this temperature despite variations in temperature. As a result, the drain-source current, which is a function of the temperature change, will rise or fall accordingly and new operating points A1 and A3 will occur as a result of the temperature change. The new operating points A1 and A3 are evident from the Figure. The operating points now constitute the points of intersection between the voltage Ubias and the respective new drain-source-currents I1 and I3 subsequent to the temperature changes.

As with the earlier described embodiment, it has been elected, in accordance with the invention, to place an electronic switch 112 between the measuring circuit 113 and the FET-transistor, so as to prevent those signals that occur during normal operation of the transistor from affecting the measuring result. The electronic switch 112 is controlled by the switching circuit 114, shown in FIG. 4. When the switch 112 is in its circuit closing position, the measuring circuit 113 is connected to the transistor source S and to the resistance 108. The measuring circuit 113, which is comprised of a voltmeter, measures the voltage across the resistance 108 and therewith also indirectly the current IDS flowing between the transistor drain and the transistor source. Distinct from the earlier described embodiment, the switching circuit 111 is controlled by a detector circuit 114. The detector circuit 114 sends a control signal when a previously strong input signal on the input RFIN falls below a predetermined low level, i.e. when a pause in transmission commences. The control signal from the detector circuit is delivered to the switching circuit 111 and also to the down-counting circuit 115. The running time of the down-counting circuit is chosen on the basis of the known duration of said transmission pause, so that a final value will be obtained before the end of said pause. When the switching circuit 111 receives the control signal from the detector circuit 114, it will close or make the switch 112, so that the temperature measuring process can take place. When the end value has been reached in the down-counting circuit 115, the circuit sends a control signal to the switching circuit 111 which then opens the switch 112.

An inventive method will now be described, using the reference signs found in FIGS. 4 and 5. The object of the method is to reproduce the temperature of a power transistor correctly, without disturbing the normal operation of the transistor and vice versa. The known, constant closed-circuit voltage delivered to the transistor gate by the voltage generator 110 determines the operating point for both the normal operation of the transistor and for the temperature measuring process. The measuring circuit 113 is pre-calibrated in the form of a conversion function with respect to the individual, combined temperature behavior of the transistor concerned and the electronic switch. The conversion function describes how a measured value of the voltage across the source resistance 108 of the transistor shall be converted to a correct value of the transistor temperature. The description begins during a transmission occasion. The method includes the following steps:

The detector circuit 114 sends a control signal which indicates to the switching circuit 111 and also to the down-counting circuit 115 that the transistor has just commenced an inactive period.

The down-counting circuit 115 begins to count down upon receiving the control signal from the detector circuit 114.

The switching circuit 111 causes the electronic switch 112 to close so as to establish a connection between the transistor source S and the measuring circuit 113, upon receipt of the control signal from the detector circuit 114.

The measuring circuit 113 measures the voltage across the resistance 108 connected to the transistor source S.

The measuring circuit 113, which is calibrated with respect to the combined temperature behavior described above, converts the measured voltage to a temperature value which corresponds correctly to the temperature of the transistor.

The down-counting circuit 115 sends a control signal to the switching circuit 111 when the final value of the down-counting circuit has been reached.

The switching circuit 111 causes the electronic switch 112 to open so as to release the connection between the transistor source S and the measuring circuit 113, upon receipt of the control signal from the down-counting circuit 115.

The majority of semiconductor components have different forms of temperature dependency that can be utilized for temperature measuring purposes. It will therefore be understood that the invention is not limited solely to the use of common-emitters or common-sources or to the types of transistors described with reference to the two exemplifying embodiments, but can be applied with semiconductor components in general. The illustrated arrangement that includes a control unit which indicates to the switching circuit when said circuit shall make or break the connection between the semiconductor component and the measuring circuit may be replaced with, for instance, a down-counting circuit or some other device that indicates when the semiconductor component is in an active or an inactive state. It will also be understood that the invention is not restricted to the aforedescribed and illustrated embodiments thereof, and that modifications can be made within the scope of the following Claims.

What is claimed is:

1. A method of measuring temperature in an intermittently operating semiconductor component, comprising the steps of:

connecting the semiconductor component to a measuring circuit;

measuring a temperature dependent electrical quantity of the semiconductor component; and converting the value of the measured quantity to a temperature value that corresponds to the temperature of the semiconductor component, and connecting the measuring circuit to the semiconductor component solely when said semiconductor component is in an inactive period.

2. A method according to claim 1, wherein connection of the measuring circuit to the semiconductor component is preceded by establishing that the semiconductor component is in an inactive period.

3. A method according to claim 1, wherein connection of the measuring circuit to the semiconductor component is caused to cease subsequent to establishing that the semiconductor component is entering an active period.

4. A method according to claim 1, wherein connection of the measuring circuit to the semiconductor component is caused to cease subsequent to a final value having been reached in a down-counting circuit.

5. A method according to claim 1, further comprising the step of:

preceding the conversion of the measured quantity with a calibration of a conversion function with respect to the semiconductor component.

6. A method according to claim 1, further comprising the step of:

decreasing the power consumption of the semiconductor component in response to an increase in the temperature value.

7. A method according to claim 1, wherein an increase in the temperature value initiates enhanced cooling of the semiconductor component.

8. A method of measuring temperature in an intermittently operating bipolar transistor that has a current-fixed base, said method comprising the steps of:

connecting a measuring circuit to the base of said transistor;

measuring the base/emitter voltage of the transistor;

converting the value of the measured voltage to a temperature value that corresponds to the temperature of the transistor, and connecting the measuring circuit to the transistor solely when the transistor is in an inactive period.

9. A method according to claim 8, wherein connection of the measuring circuit to the transistor is preceded by establishing that the transistor is in an inactive period.

10. A method according to claim 8, wherein connection of the measuring circuit is released subsequent to establishing that the transistor is entering an active period.

11. A method according to claim 8, wherein connection of the measuring circuit to the transistor is released subsequent to having reached a final value in a down-counting circuit.

12. A method according to claim 8, further comprising the step of:

calibrating a conversion function with respect to the transistor prior to said conversion of the measured voltage.

13. A method according to claim 8, further comprising the step of:

following an increase in the temperature value with a decrease in the power consumption of the transistor.

14. A method according to claim 8, wherein an increase in the temperature value initiates enhanced cooling of the transistor.

15. A method of measuring temperature in an intermittently operating field effect transistor that has a voltage fixed gate, wherein the method comprises the steps of:

connecting a measuring circuit to the transistor source;

measuring the current through the transistor source; and converting the measured current value to a temperature value that corresponds to the temperature of the transistor, and connecting the measuring circuit to the transistor source solely when the transistor is in an inactive period.

16. A method according to claim 15, wherein connection of the measuring circuit to the transistor is preceded by establishing that the transistor is in an inactive period.

17. A method according to claim 15, wherein the measuring circuit connection is released subsequent to establishing that the transistor is entering an active period.

18. A method according to claim 15, wherein connection of the measuring circuit to the transistor is released subsequent to having reached a final value in a down-counting circuit.

19. A method according to claim 15, wherein conversion of the measured current is preceded by a calibration of a conversion function with respect to the transistor.

20. A method according to claim 15, wherein an increase in the temperature value is followed by a decrease in the power consumption of the transistor.

21. A method according to claim 15, wherein an increase in the temperature value initiates enhanced cooling of the transistor.

22. In combination, an intermittently operating semiconductor component and an arrangement for measuring temperature in the intermittently operating semiconductor component, wherein the arrangement includes:

means in the form of a measuring circuit for measuring a temperature dependent electrical quantity of the semiconductor component;

means for connecting said measuring circuit to said semiconductor component;

means for convering the measured value of said quantity to a value that corresponds to the temperature of the semiconductor component, and means for ensuring that the measuring circuit will be connected to the semiconductor component solely when the semiconductor component is in an inactive period.

23. In combination, an intermittently operating bipolar transistor, having a current-fixed base and an arrangement for measuring temperature in the intermittently operating bipolar transistor having a current-fixed base, said arrangement including means in the form of a measuring circuit for measuring the base/emitter-voltage of the transistor;

means for connecting said measuring circuit to the transistor base;

means for converting the measured voltage value to a value that corresponds to the temperature of the transistor, and means for ensuring that the measuring circuit will be connected to the transistor solely when the transistor is in an inactive period.

24. In combination, an intermittently operating field effect transistor, having a voltage-fixed base and an arrangement for measuring temperature in the intermintly operating field effect transistor having a voltage-fixed gate, said arrangement including means in the form of a measuring circuit for measuring the source-current of the transistor;

means for connecting said measuring circuit to the transistor source;

means for converting the measured current value to a value that corresponds to the temperature of the transistor, and means for ensuring that the measuring circuit will be connected to the transistor solely when the transistor is in an inactive period.

* * * * *